United States Patent
Chen et al.

(10) Patent No.: US 11,410,945 B2
(45) Date of Patent: Aug. 9, 2022

(54) SEMICONDUCTOR PACKAGE HAVING PARTIAL OUTER METAL LAYER AND PACKAGING METHOD THEREOF

(71) Applicant: Powertech Technology Inc., Hukou Township, Hsinchu County (TW)

(72) Inventors: Shih-Chun Chen, Hsinchu (TW); Sheng-Tou Tseng, Hsinchu (TW); Kun-Chi Hsu, Hsinchu (TW); Chin-Ta Wu, Hsinchu (TW); Ying-Lin Chen, Hsinchu (TW); Ting-Yeh Wu, Hsinchu (TW)

(73) Assignee: Powertech Technology Inc., Hukou Township (TW)

( * ) Notice: Subject to any disclaimer, the term of this patent is extended or adjusted under 35 U.S.C. 154(b) by 39 days.

(21) Appl. No.: 17/094,101

(22) Filed: Nov. 10, 2020

(65) Prior Publication Data

US 2021/0288003 A1 Sep. 16, 2021

(30) Foreign Application Priority Data

Mar. 13, 2020 (TW) .................. 109108482

(51) Int. Cl.
| | |
|---|---|
| *H01L 23/66* | (2006.01) |
| *H01L 25/065* | (2006.01) |
| *H01L 23/31* | (2006.01) |
| *H01L 23/00* | (2006.01) |
| *H01L 23/538* | (2006.01) |
| *H01L 21/56* | (2006.01) |
| *H01Q 1/22* | (2006.01) |

(52) U.S. Cl.
CPC ............. *H01L 23/66* (2013.01); *H01L 21/56* (2013.01); *H01L 23/31* (2013.01); *H01L 23/5386* (2013.01); *H01L 24/96* (2013.01); *H01L 25/0655* (2013.01); *H01Q 1/2283* (2013.01)

(58) Field of Classification Search
CPC ..... H01L 23/66; H01L 23/31; H01L 23/5386; H01L 23/3121; H01L 21/56; H01L 21/561; H01L 21/6835; H01L 24/96; H01L 25/0655; H01L 25/18; H01L 2223/6677
USPC .......................................... 257/728
See application file for complete search history.

(56) References Cited

U.S. PATENT DOCUMENTS

| | | | |
|---|---|---|---|
| 8,368,192 B1* | 2/2013 | Chen ....................... | H01L 23/60 257/676 |
| 2015/0223339 A1* | 8/2015 | Nakamura .......... | H01L 23/3107 361/779 |
| 2017/0077039 A1* | 3/2017 | Liao ....................... | H01L 23/552 |
| 2017/0294387 A1* | 10/2017 | Kawabata ............. | H01L 21/485 |
| 2018/0199428 A1* | 7/2018 | Otsubo ................... | H01L 23/552 |
| 2020/0091608 A1* | 3/2020 | Alpman ................ | H01Q 25/001 |
| 2021/0066206 A1* | 3/2021 | Oh ....................... | H01L 23/3128 |

FOREIGN PATENT DOCUMENTS

| | | |
|---|---|---|
| TW | 200830496 A | 7/2008 |
| TW | 201740612 A | 11/2017 |
| TW | 201931558 A | 8/2019 |

\* cited by examiner

*Primary Examiner* — Dao H Nguyen
(74) *Attorney, Agent, or Firm* — Patenttm.us

(57) ABSTRACT

A semiconductor package having a partial outer metal layer and packaging method thereof is disclosed. In the method, a specific packaging substrate or a specific positioning plate is used to package multiple semiconductor devices and a partial outer metal layer is quickly formed on an encapsulation of each semiconductor device in the same step.

5 Claims, 17 Drawing Sheets

SEMICONDUCTOR PACKAGE HAVING PARTIAL OUTER METAL LAYER AND PACKAGING METHOD THEREOF

CROSS-REFERENCE TO RELATED APPLICATIONS

This application is based upon and claims priority under 35 U.S.C. 119 from Taiwan Patent Application No. 109108482 filed on Mar. 13, 2020, which is hereby specifically incorporated herein by this reference thereto.

BACKGROUND OF THE INVENTION

1. Field of the Invention

The present invention relates to a semiconductor package having an outer metal layer and packaging method thereof, and more particularly to a semiconductor package having a partial outer metal layer and packaging method thereof.

2. Description of the Prior Arts

A semiconductor package integrated with a high-frequency device is needed when considering the design of the integrated circuit (IC) applied for the technology such as blue tooth, 5G (5th generation) or 5G WIFI. To prevent the IC from malfunction caused by the signal interference from the high-frequency device (such as an antenna), it is necessary to isolate the signal from the high-frequency devices.

With reference to FIG. 7A, multiple semiconductor packages 90 integrating the antennas are attached to a positioning plate 91. Each of the semiconductor packages 90 has a chip 902 and an antenna 903 disposed at a substrate 901. Both of the chip 902 and the antenna 903 are encapsulated by an encapsulation 904. Sequentially, preparing multiple masks 92 and aligning the masks 92 towards the semiconductor packages 90 before attaching to the positioning plate 91. Then each of the masks 92 covers a partial outer layer of the encapsulation 904 where the antenna 903 is disposed correspondingly. Next, as shown in FIG. 7B, a metal layer 93 is formed on the other portion of the outer layer of the encapsulation 904 of each semiconductor package 90. After removing the masks 92 as shown in FIG. 7C, multiple semiconductor packages 90' each of which has a partial metal shielding layer is formed.

However, it costs lots of time and extra process for the above process that forms the partial outer metal layer of the encapsulation of the semiconductor package. It primarily results from the steps of individually aligning each of the masks to the corresponding semiconductor package after attaching the multiple semiconductor packages to the positioning plate. Besides, if the misalignment of the mask happened, it may be unable for the metal layer to be formed in the right position, which may decrease the ability to shield the electromagnetic wave signal. Therefore, a further amendment is demanded. To overcome the shortcomings, the present invention provides a semiconductor package having a partial outer metal layer and packaging method thereof to mitigate or to obviate the aforementioned problems.

SUMMARY OF THE INVENTION

An objective of the present invention is to provide a semiconductor package having a partial outer metal layer and packaging method thereof.

To achieve the objective as mentioned above, the semiconductor package having a partial outer metal layer has:

a substrate having a first substrate part and a second substrate part; wherein the second substrate part extending horizontally from a lateral side of the first substrate part and a width of the second substrate part is smaller than a width of the first substrate part;

a high-frequency device bonded to the first substrate part;

a chip bonded to the second substrate part;

an encapsulation formed on the substrate and encapsulating the chip and the high-frequency device; and a metal layer covering multiple exterior sides of the encapsulation corresponding to the second substrate part.

From the above description, the semiconductor package having a partial outer metal layer primarily uses the substrate with specific shape whereas the second substrate part providing for the chip bonding is relatively smaller that is convenient for forming the metal layer at the exterior side of the encapsulation corresponding to the chip rapidly and comprehensively. The metal layer is provided for shielding the chip from the interference of the electromagnetic wave signal.

To achieve the above objective, a packaging method for a semiconductor package having a partial outer metal layer, comprising:

(a) providing a substrate for packaging; wherein the substrate having at least one long groove and multiple short channels interconnected with each other whereas each of the short channels is equally arrayed with an interval in parallel and the interval is formed as a device bonding area;

(b) bonding multiple chips to the device bonding areas on the substrate correspondingly, wherein each of the chips approaches to the long groove, each of the high-frequency device is bonded to the peripheral area of the device bonding areas and departing from the long groove;

(c) forming an encapsulation on the substrate to encapsulate the chips and the high-frequency devices on the substrate;

(d) forming a metal layer on the encapsulation corresponding to each of the device bonding areas; and (e) cutting the substrate along with each of the short channels to divide multiple semiconductor packages, and each of the semiconductor packages has a partial outer metal layer.

From the above description, the packaging method in accordance with the present invention primarily provides a packaging substrate with specific design. After the chips and the high-frequency devices bonding to the substrate and molded as the encapsulation, the metal layer may be formed on the encapsulation corresponding to each of the device bonding areas rapidly and comprehensively in the same step. Next the cutting process is executed to divide multiple semiconductor packages having a partial outer metal layer.

To achieve the above objective, another packaging method for a semiconductor package having a partial outer metal layer, comprising:

(a) providing a positioning plate, the positioning plate having multiple positioning openings, each of the openings having a first cavity and a second cavity, wherein the first cavity is larger than the second cavity;

(b) placing multiple semiconductor packages at the positioning openings; wherein each of the semiconductor packages has a substrate, a chip, a high-frequency device and an encapsulation that encapsulates both of the chip and the high-frequency device, the encapsulation of each of the semiconductor packages having a first portion corresponding to the high-frequency device is disposed at the second cavity individually, and a second portion of the encapsulation of each of the semiconductor packages corresponding to the chip is located at the first cavity respectively, wherein three sidewalls of the encapsulation are kept a gap to the first cavity.

(c) enclosing the second cavity;

(d) forming multiple metal layers on the second portion of the encapsulation corresponding to the semiconductor packages located at the first cavity; and (e) opening the second cavity and removing each of the semiconductor packages.

From the above description, the packaging method in accordance with the present invention primarily provides a packaging substrate with specific design. Placing the semiconductor packages integrated with the chips and the high-frequency devices in the openings of the positioning plate respectively, wherein each of the high-frequency devices of the semiconductor packages is located at the second cavity of the opening accordingly, and each of the chips of the semiconductor packages is disposed at the relatively larger first cavity of the opening. Therefore, the external sidewalls of the semiconductor package are kept a gap to the internal sidewall of the first cavity. When the second cavities are enclosed and the first cavities are exposed, the metal layers may be formed on the exposed first cavities in the same step. After opening the second cavity, a large quantity of semiconductor packages having a partial outer metal layer may be uncovered.

Other objectives, advantages and novel features of the invention will become more apparent from the following detailed description when taken in conjunction with the accompanying drawings.

DETAILED DESCRIPTION OF THE EMBODIMENTS

The present invention relates to a novel semiconductor package having a partial outer metal layer and packaging method thereof, which is capable of overcoming the drawback of time-consuming and low yield rate. Multiple embodiments are illustrated with the figures below to describe in detail.

Figure 1A:
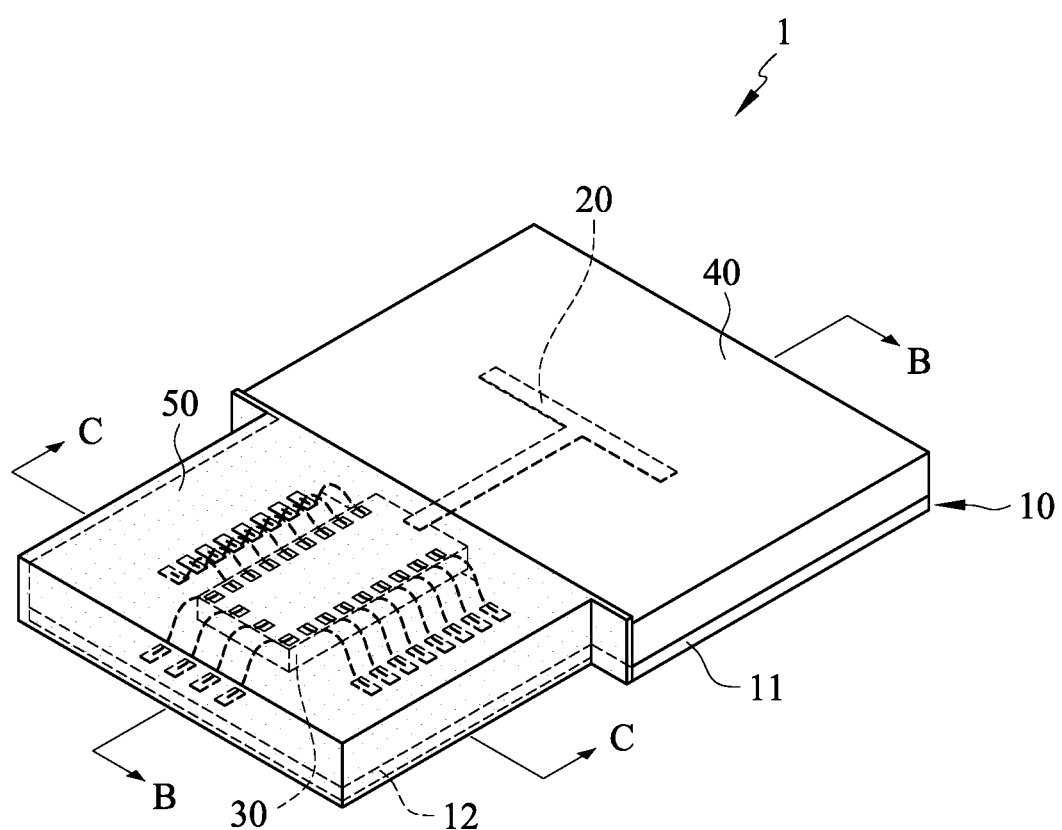
FIG. 1A is a perspective view of a first embodiment of a semiconductor package having a partial outer metal layer in accordance with the present invention.
Figure 1B:
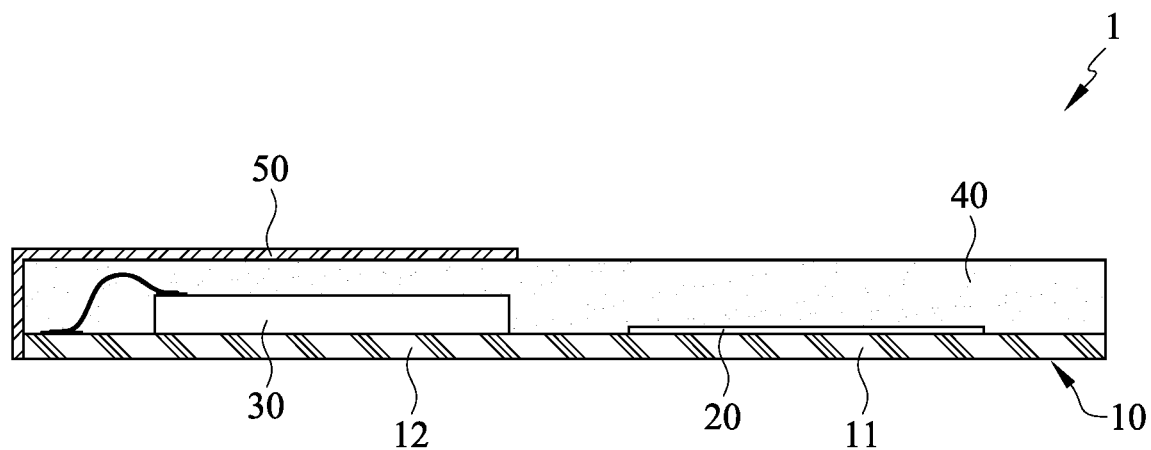
FIG. 1B is a cross-sectional view of FIG. 1A along with the B-B line.
Figure 1C:
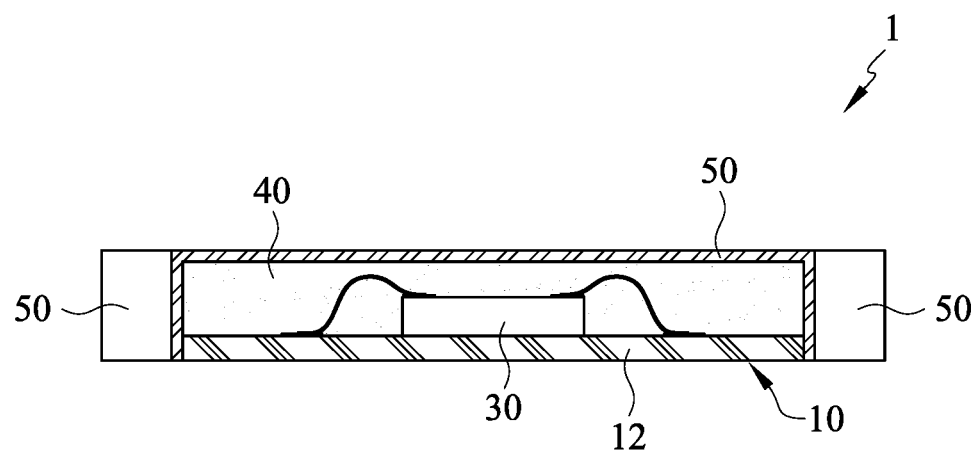
FIG. 1C is a cross-sectional view of FIG. 1A along with the C-C line.

Firstly, with reference to FIG. 1A, FIG. 1B and FIG. 1C, a first embodiment of the semiconductor package 1 having a partial outer metal layer in accordance with the present invention is shown. The semiconductor package 1 has a substrate 10, a high-frequency device 20, a chip 30, an encapsulation 40 and a metal layer 50.

The substrate 10 has a first substrate part 11 and a second substrate part 12. The second substrate part 12 extends horizontally from a lateral side of the first substrate part 11. In addition, a width of the second substrate part 12 is smaller than the width of the first substrate part 11. In this embodiment, the perspective view for the shape of the substrate 10 is appeared as a Chinese character font "凸".

The high-frequency device 20 is bonded to the first substrate part 11. In this embodiment, the high-frequency device 20 has but not limited to an antenna, such as a communicating antenna applied for the technology field of blue tooth, 5G (5th generation) or 5G WIFI The chip 30 is bonded to the second substrate part 12 of the substrate 10. In this embodiment, the chip 30 is wire-bonded to the second substrate part 12, but the flip-chip bonding is applicable as well.

The encapsulation 40 is formed on the substrate 10 and encapsulates both of the chip 30 and the high-frequency device 20. In this embodiment, the encapsulation 40 is formed by a compression mold.

The metal layer 50 is formed at multiple exterior sides of the encapsulation 40 corresponding to the second substrate part 12. In this embodiment, the metal layer 50 further covers the external sides of the second substrate part 12, and the external sides of the first substrate part 11 are adjacent to the second substrate part 12.

Hereinafter a packaging method for the aforementioned semiconductor package having a partial outer metal layer 50 may be further described. With reference to FIG. 2A to FIG. 2G, the packaging method for a semiconductor package 1 having a partial outer metal layer has the following step (a) to step (e).

Figure 2A:
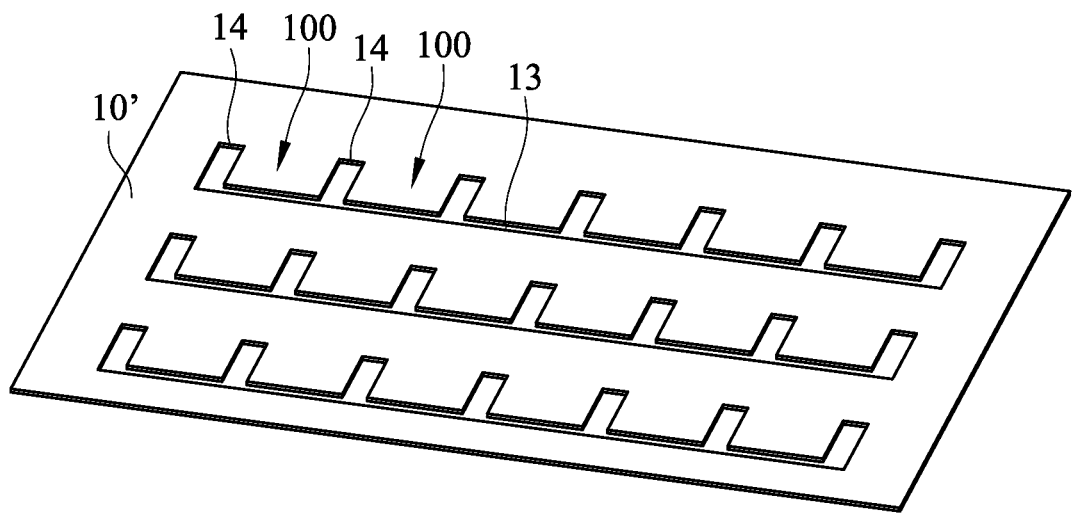
FIG. 2A to 2G are perspective views of different steps of a first embodiment of a packaging method in accordance with the present invention.

In the step (a), as shown in FIG. 2A, a substrate 10' for packaging is provided. The substrate 10' has at least one long groove 13 and multiple short channels 14 interconnected with the at least one long groove 13. Each of the short channels 14 is equally arrayed with an interval in parallel and the interval between the two consecutive short channels 14 is defined as a device bonding area 100. In the embodiment, the long groove 13 and the short channels 14 interconnected with each other is formed as a comb-shaped groove, and the substrate 10' has three rows of comb-shaped grooves arrayed in parallel as shown in the figures.

Figure 2B:
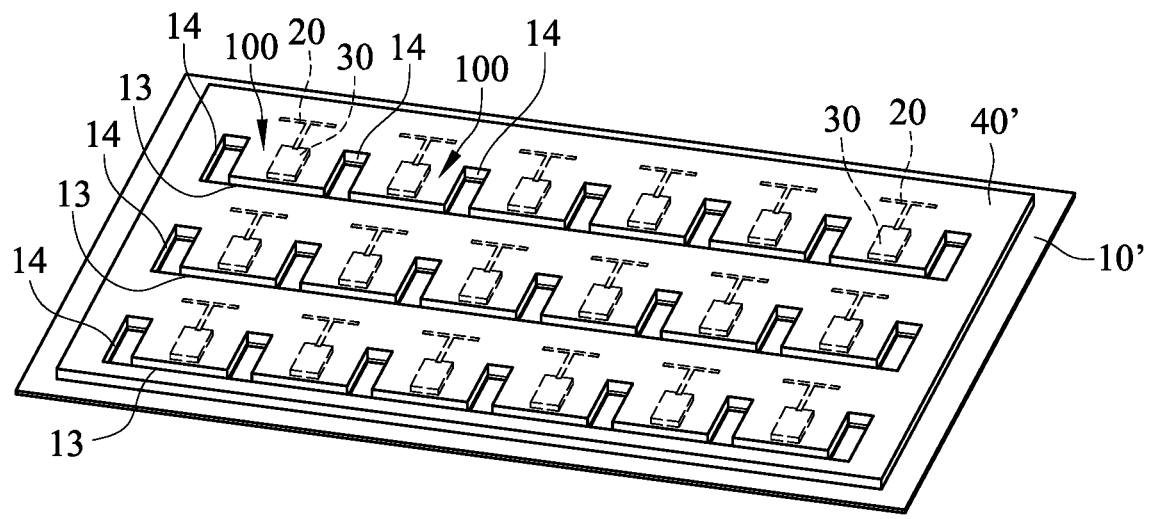
Figure 2C:
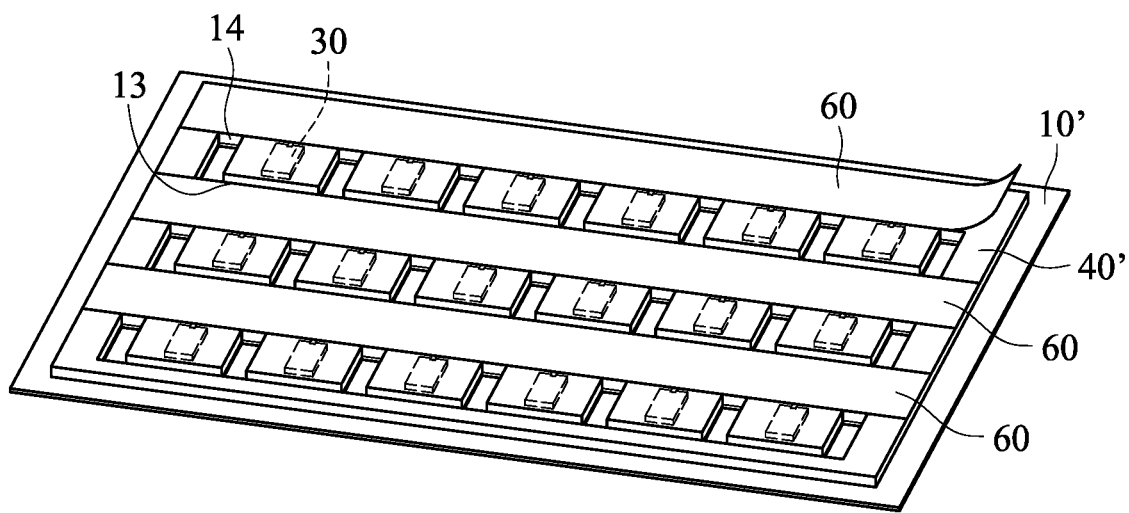

In the step (b), as shown in FIG. 2B, multiple chips 30 are provided. The chips 30 are placed at the device bonding area 100 of the substrate 10' respectively. Each of the chips 30 approaches to the long groove 13. Each of the high-frequency devices 20 is bonded outside the device bonding areas 100 and departs from the long groove 13.

In the step (c), as shown in FIG. 2B, an encapsulation 40' is provided. The encapsulation 40' is formed on the substrate 10' to cover the chips 30 and the high-frequency devices 20 on the substrate 10'. In this embodiment, the encapsulation 40 is formed by a compression mold. The compression mold is adapted for the comb-shaped long grooves of the substrate 10', so that the shape of the encapsulation 40 is adapted for the substrate 10' and capable of keeping the comb-shaped long groove exposed after the compression molding.

Figure 2D:
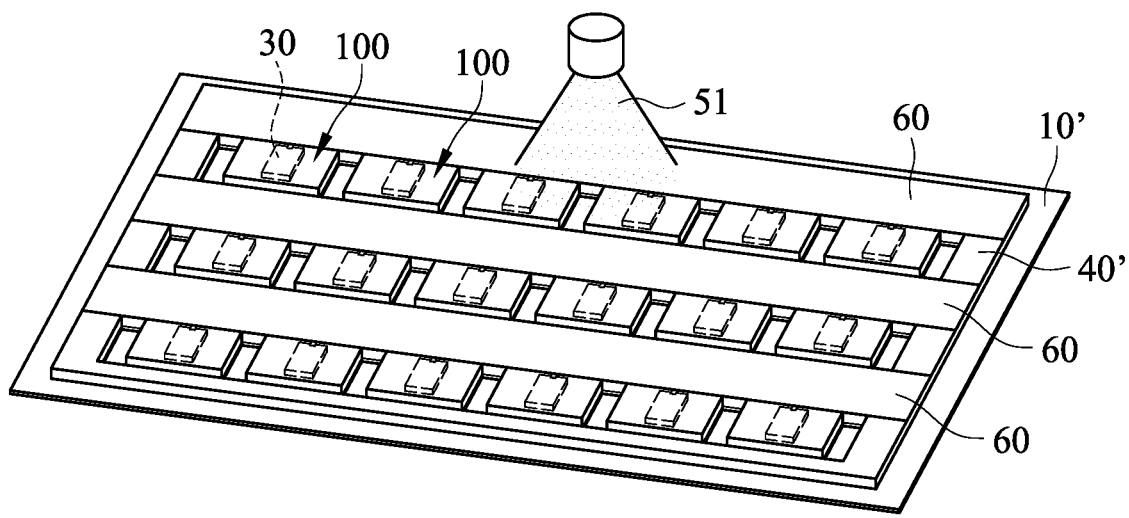
Figure 2E:
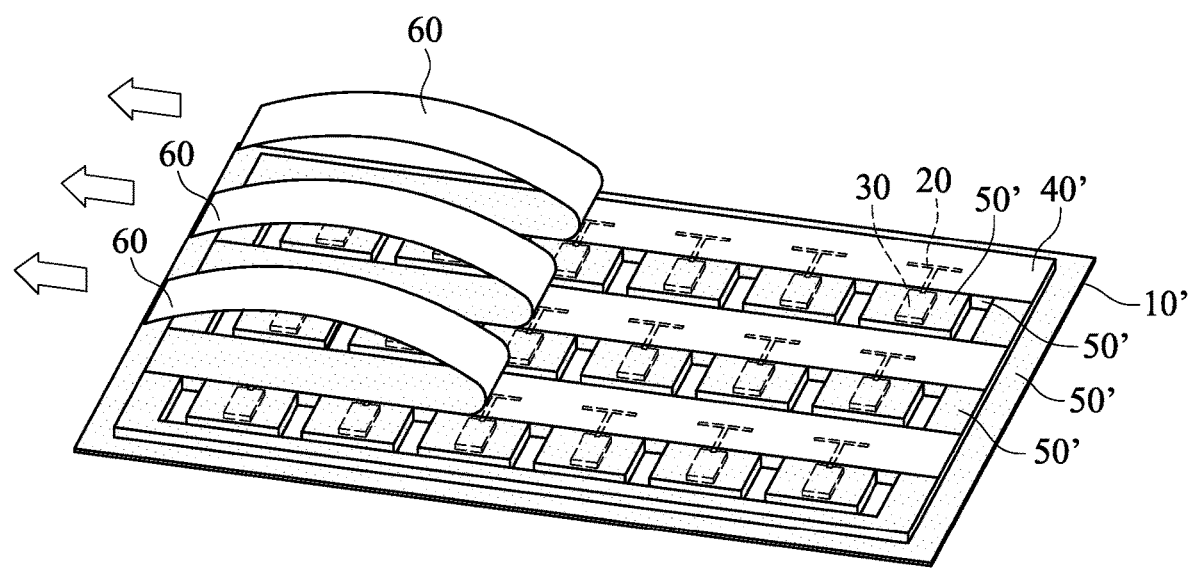

In the step (d), as shown in FIG. 2B to FIG. 2E, a metal layer 50' is provided. The metal layer 50' is formed on the encapsulation 40' corresponding to each of the device bonding areas 100. In this embodiment, three tapes 60 are prepared in advance, next each of the tapes 60 is attached on the encapsulation 40' corresponding to the high-frequency devices 20 along with a direction parallel to the long groove 13. As shown in FIG. 2D, the metallic ions 51 are deposited on an exposed portion of the substrate 10' by a process of sputtering or spraying. As shown in the figure, the taps 60, the exposed portion of the encapsulation 40' and the exposed lateral sides of the substrate 10' approaching to the comb-shaped grooves are deposited with the metallic ions 51 to form the metal layer. As a result, as shown in FIG. 2E, the metal layer 50' on the encapsulation 40' corresponding to all of the device bonding areas 100 may be formed in the same step. In addition, the metal layer 50' are comprehensively formed on a top surface as well as three lateral sides of the device bonding areas 100. Next, the tapes 60 are removed. In other words, the portion of the encapsulation 40' corresponding to the high-frequency devices 20 may not have the metal layer after the metal layer deposition process.

Figure 2F:
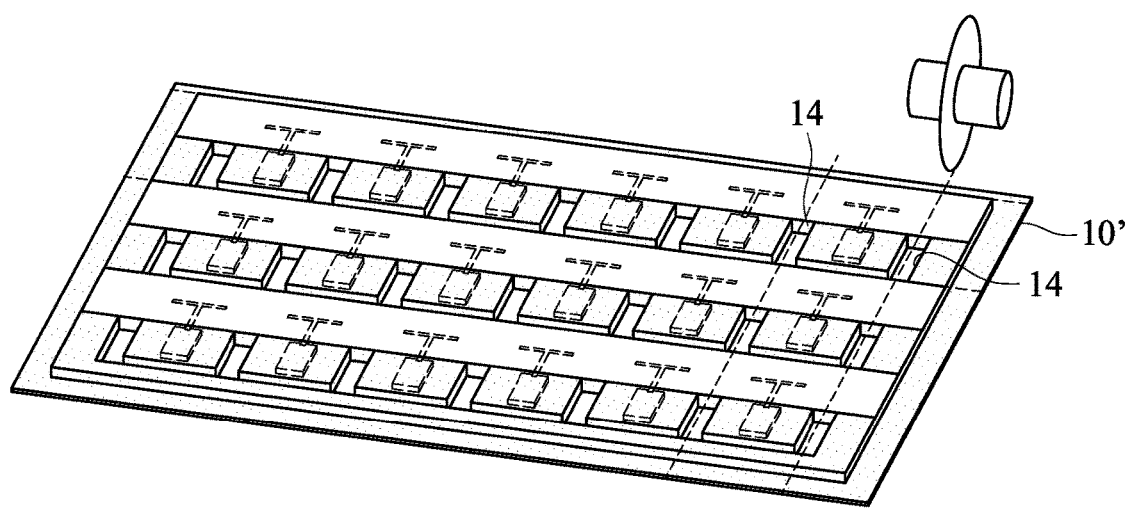
Figure 2G:
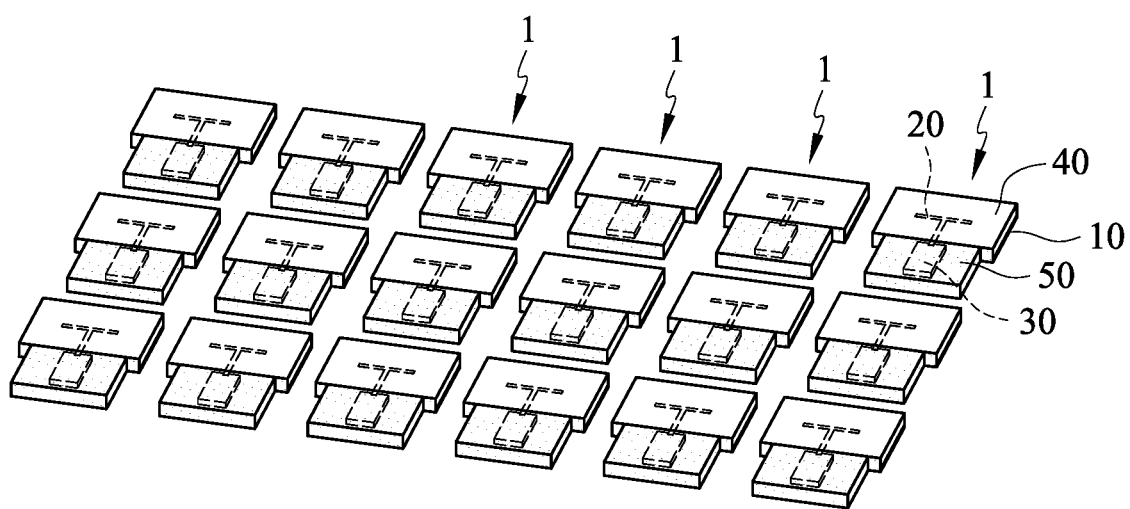

In the step (e), as shown in FIG. 2F and FIG. 2G, the substrate 10' is cut along with each of the short channels 14 to divide multiple semiconductor packages 1. Each of the semiconductor packages 1 has a partial outer metal layer. In this embodiment, the cutting route is aligned with the central line of each of a width of the short channels 14, so the complete reservation of the metal layer 50' formed on the bilateral sides of the encapsulation 40' corresponding to each of the chips 30 may be guaranteed. Therefore, the semiconductor package provided by the embodiment is appeared as a Chinese character font " 凸 ".

With reference from FIG. 3A to FIG. 3E, since the step (a) to the step (c) of the second preferred embodiment of the packaging method for the semiconductor package is the same with the steps adopted in the first embodiment, the following description may emphasize more detail as regard to the step (d) and the step (e).

Figure 3A:
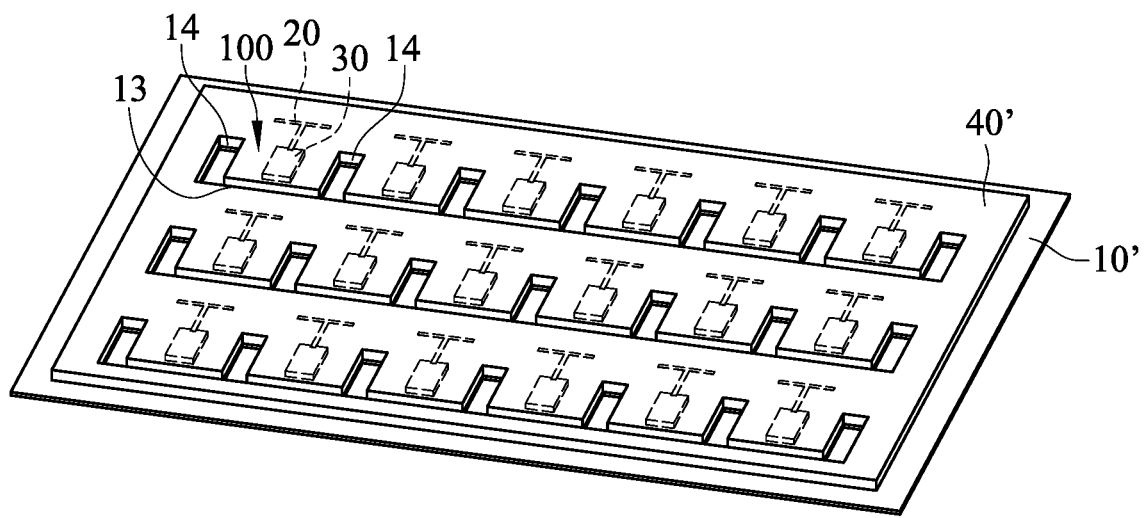
FIG. 3A to 3E are perspective views of different steps of a second embodiment of a packaging method in accordance with the present invention.
Figure 3B:
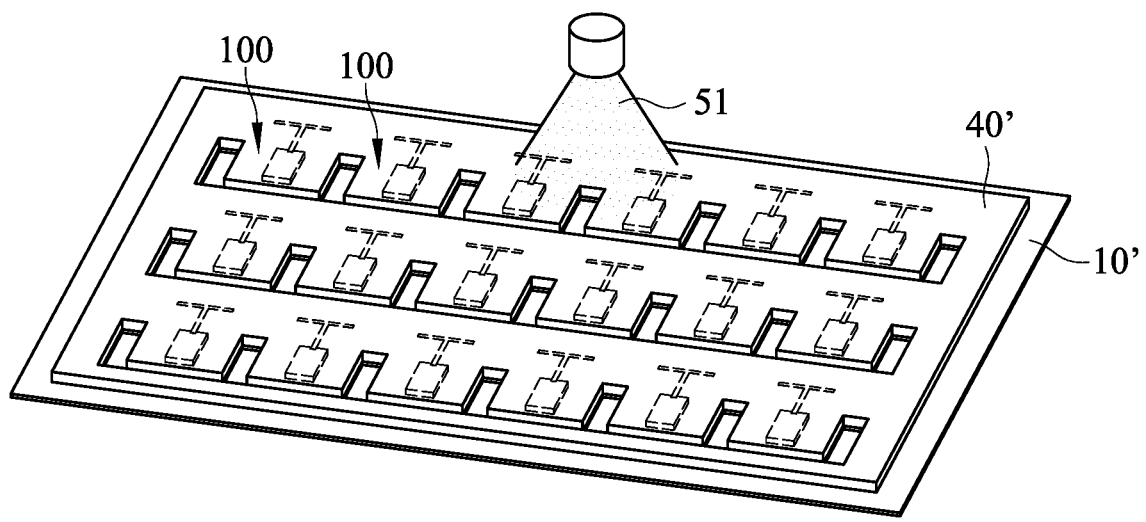
Figure 3C:
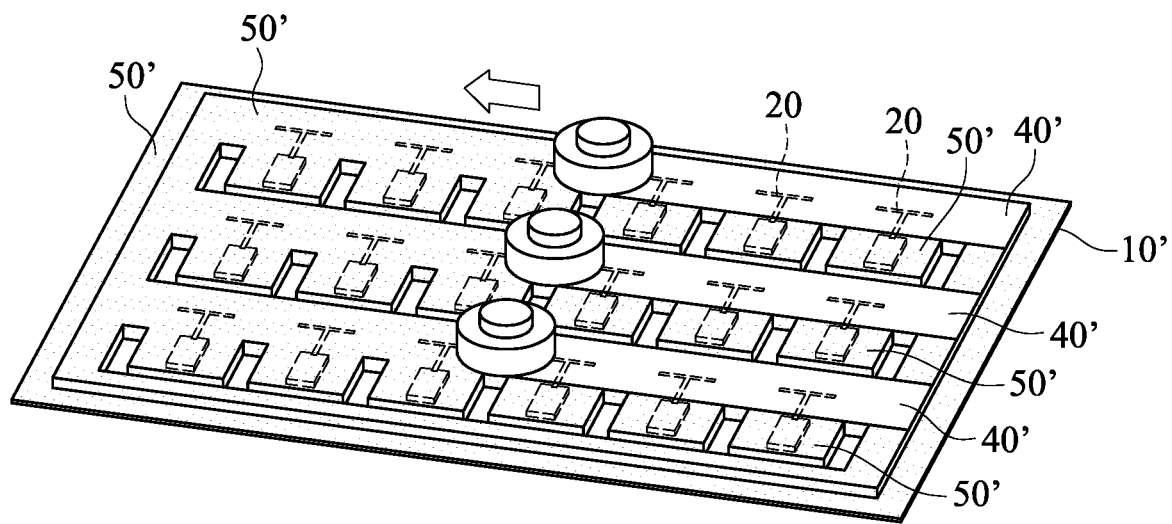

In the step (d), as shown in FIG. 3A to FIG. 3C, the metallic ions 51 are deposited on an exposed portion of the substrate 10' by a process of sputtering or spraying. As shown in the figure, the encapsulation 40' and the exposed lateral sides of the substrate 10' approaching to the comb-shaped grooves are deposited with the metallic ions 51 to form the metal layer 50'. As further shown in FIG. 3C, a portion of the encapsulation 40' corresponding to the high-frequency devices 20 that has the metal layer 50' is removed by a grinder to make the portion of the encapsulation 40' exposed. Besides, other metal removal methods such as laser ablation or dry etching are applicable as well.

Figure 3D:
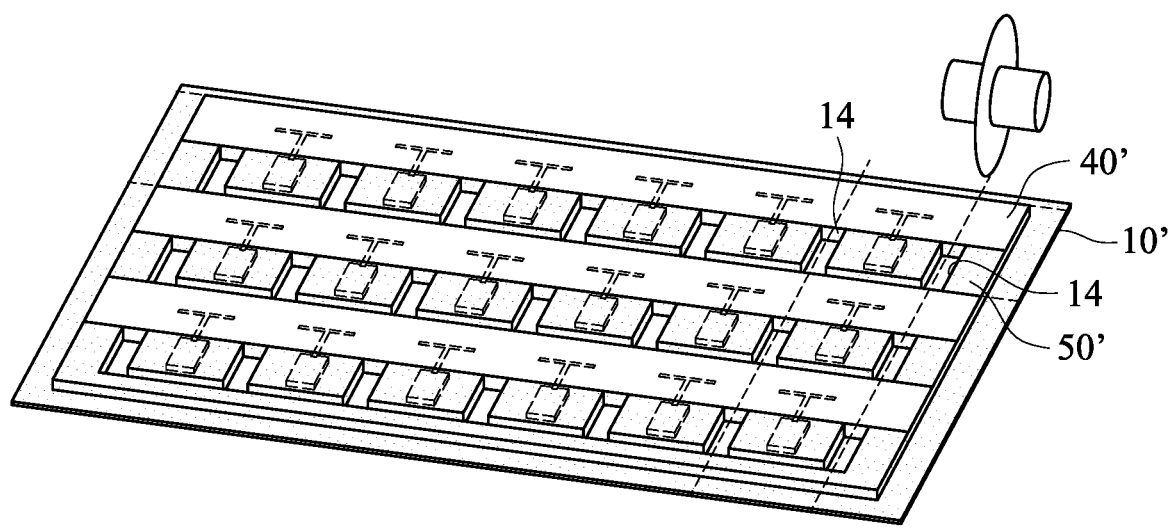
Figure 3E:
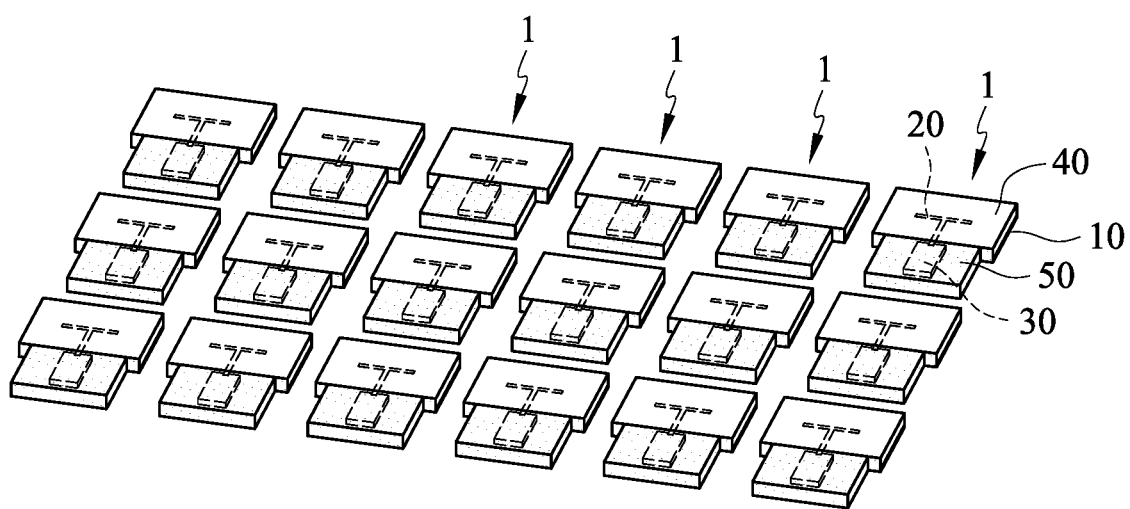

In the step (e), as shown in FIG. 3D and FIG. 3E, the substrate 10' is cut along with each of the short channels 14 to divide multiple semiconductor packages 1. Each of the semiconductor packages 1 has a partial outer metal layer. In this embodiment, the cutting route is aligned with the central line of each of a width of the short channels 14, so the complete reservation of the metal layer 50' formed on the bilateral sides of the encapsulation 40' corresponding to each of the chips 30 may be guaranteed. Therefore, the semiconductor package provided by the embodiment is appeared as a Chinese character font " 冂 ".

Figure 4:
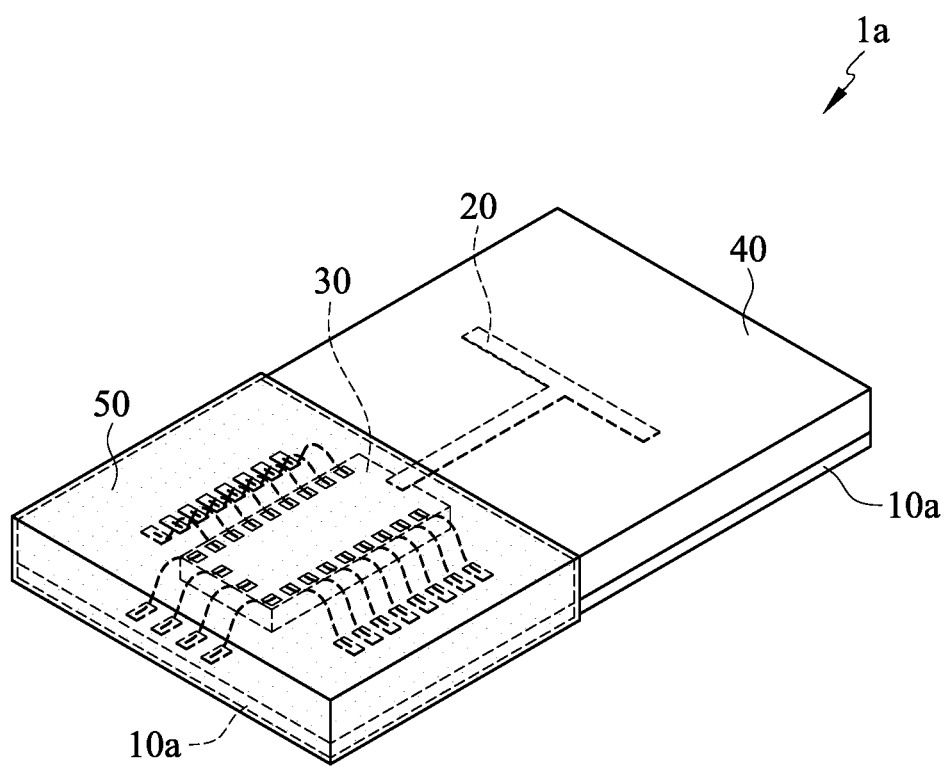
FIG. 4 is a perspective view of a second embodiment of a semiconductor package having a partial outer metal layer in accordance with the present invention.

With further reference to FIG. 4, the second embodiment of the semiconductor package 1a having a partial outer metal layer in accordance with the present invention is provided. The semiconductor package 1a has a substrate 10a, a high-frequency device 20, a chip 30, an encapsulation 40 and a metal layer 50, wherein the chip 30 and the high-frequency device 20 are bonding to the substrate 10a respectively, the encapsulation 40 is formed on the substrate 10a and encapsulates both of the chip 30 and the high-frequency device 20. In this embodiment, the semiconductor package 1a appears as a shape of rectangle.

With reference to FIG. 5A to FIG. 5F, another packaging method for the semiconductor package 1a in accordance with the present invention has the following step (a) to step (e).

Figure 5A:
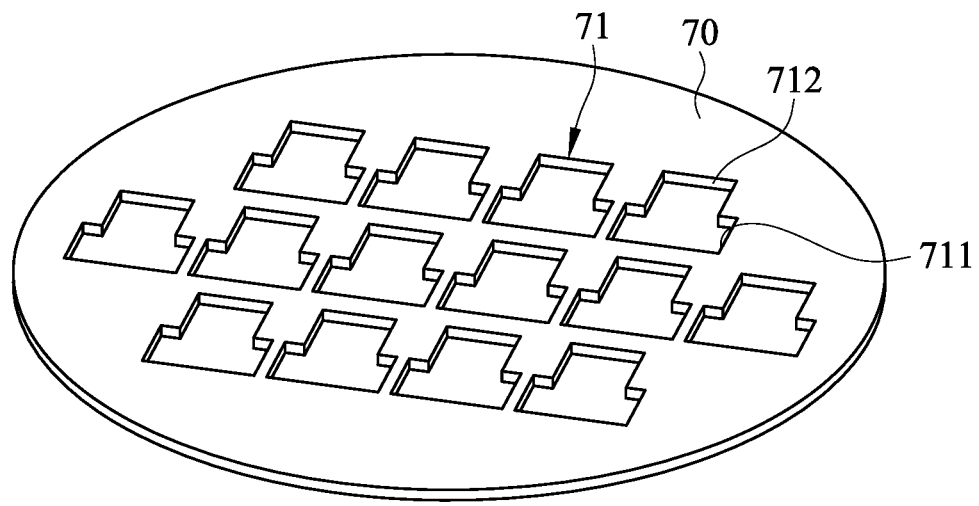
FIG. 5A to 5F are perspective views of different steps of a third embodiment of the packaging method in accordance with the present invention.

In the step (a), as shown in FIG. 5A, a positioning plate 70 is provided. The positioning plate 70 has multiple positioning openings 71. Each of the openings 71 has a first cavity 711 and a second cavity 712. As shown in the figure, the first cavity 711 is larger than the second cavity 712. In this embodiment, the openings 71 of the positioning plate 70 include but not limited to be arranged in three rows.

Figure 5B:
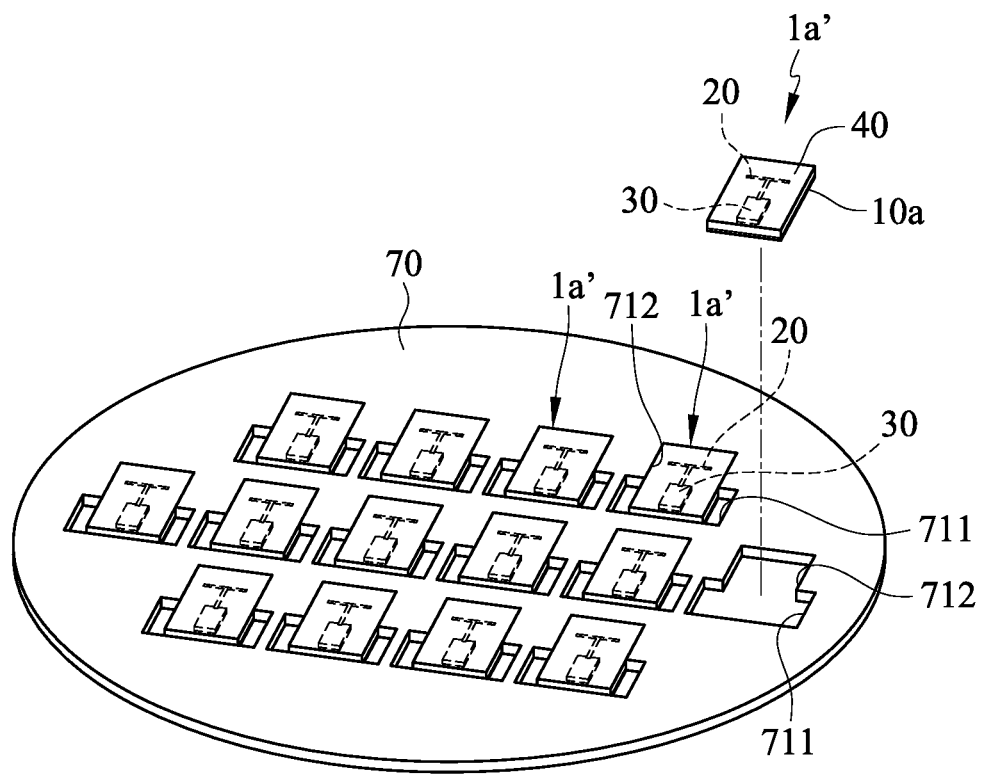

In the step (b), as shown in FIG. 5B, multiple semiconductor packages 1a' are provided. The semiconductor packages 1a' are placed at the openings 71 respectively. As shown in the figure, each of the semiconductor packages 1a' has a substrate 10a, a chip 30, a high-frequency device 20 and an encapsulation 40 that encapsulates both of the chip 30 and the high-frequency device 20. The encapsulation 40 of each of the semiconductor packages 1a' has a first portion and a second portion. The first portion of the encapsulation 40 corresponds to the high-frequency device 20 and is disposed at the second cavity 712 individually. The second portion of the encapsulation 40 corresponds to the chip 30 and is located at the first cavity 711 respectively. As shown in the figure, three sidewalls of each of the encapsulation of the semiconductor packages 1a' corresponding to the chip 30 have a gap with the first cavity 711.

Figure 5C:
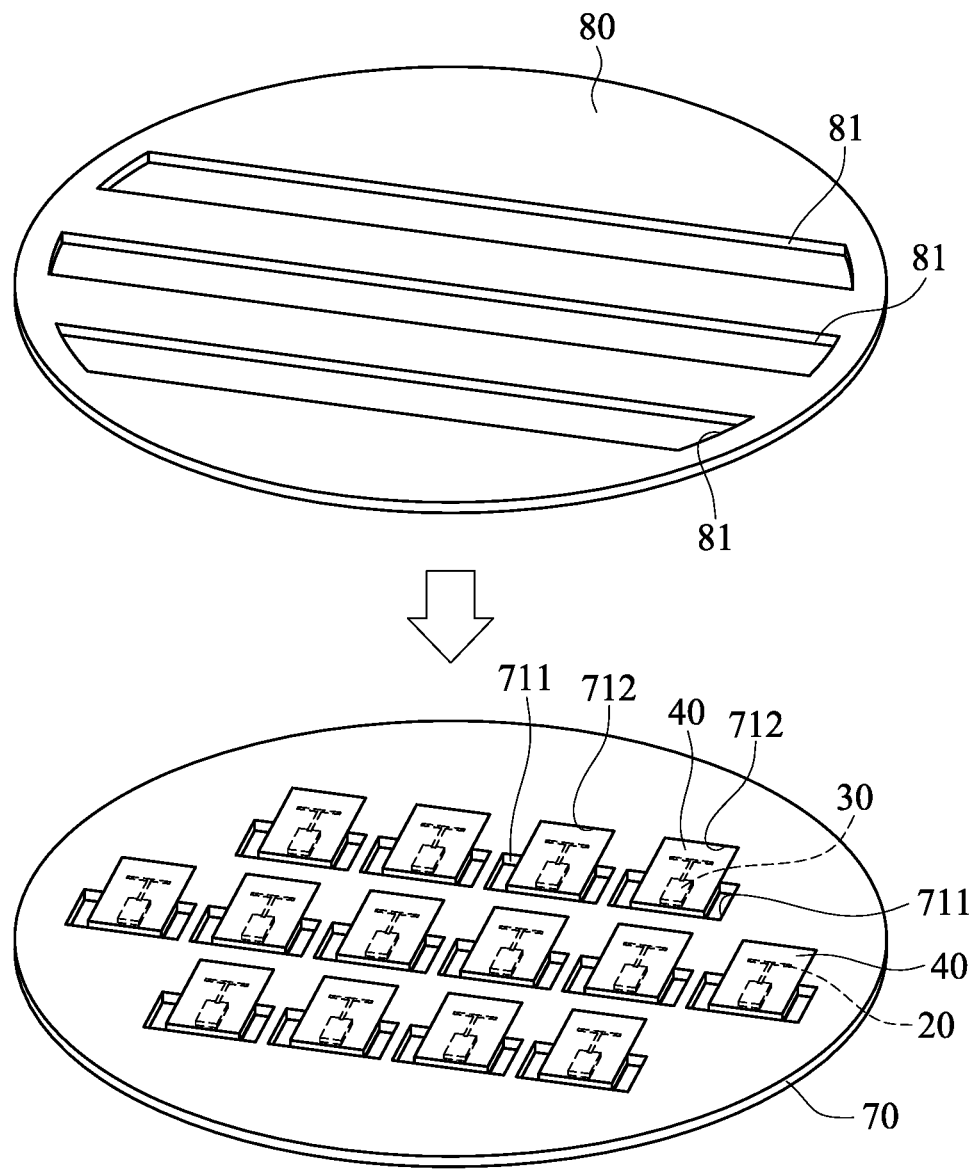
Figure 6:
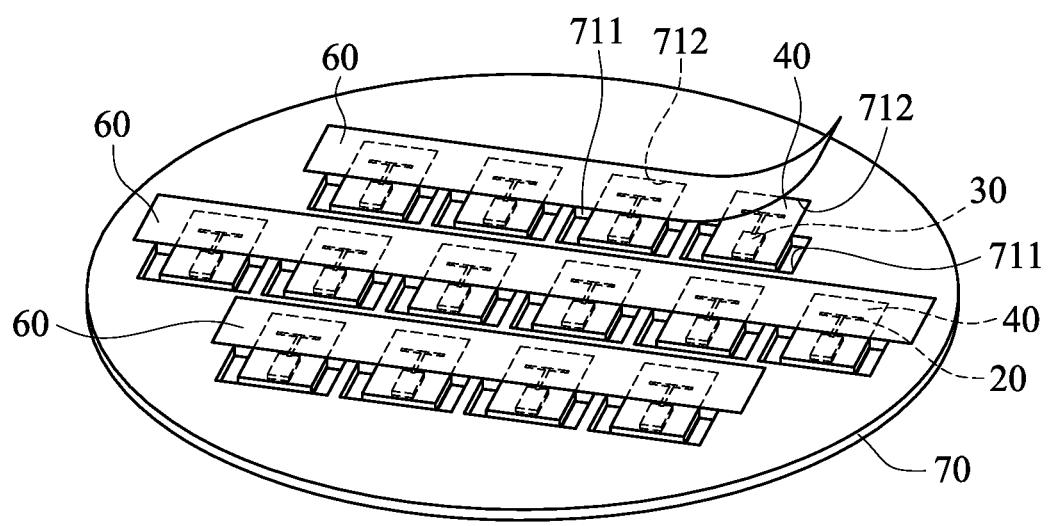
FIG. 6 is a perspective view of one step of a fourth embodiment of the packaging method in accordance with the present invention.
Figure 7A:
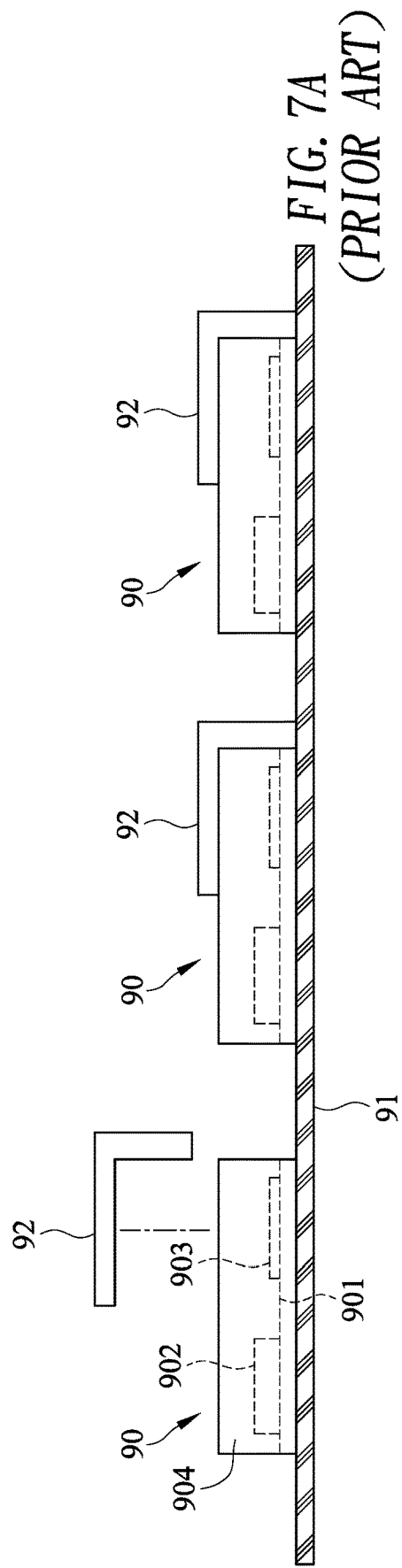
FIG. 7A to 7C are lateral views of different steps of a manufacturing process of a semiconductor package having a partial outer metal layer.
Figure 7B:
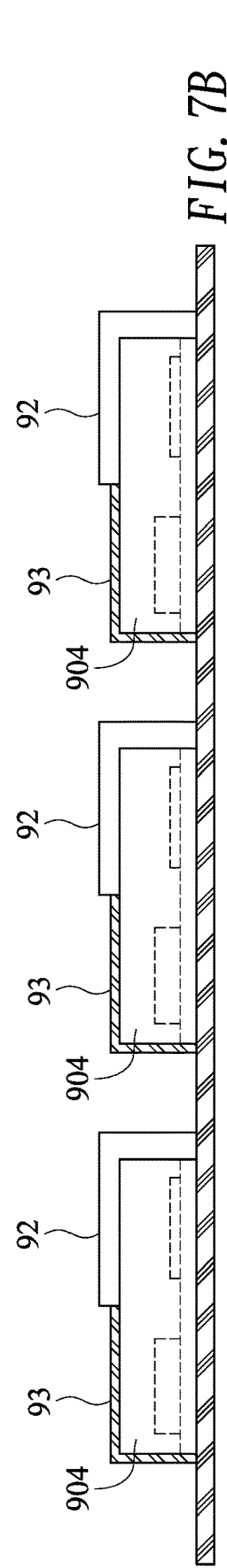
Figure 7C:
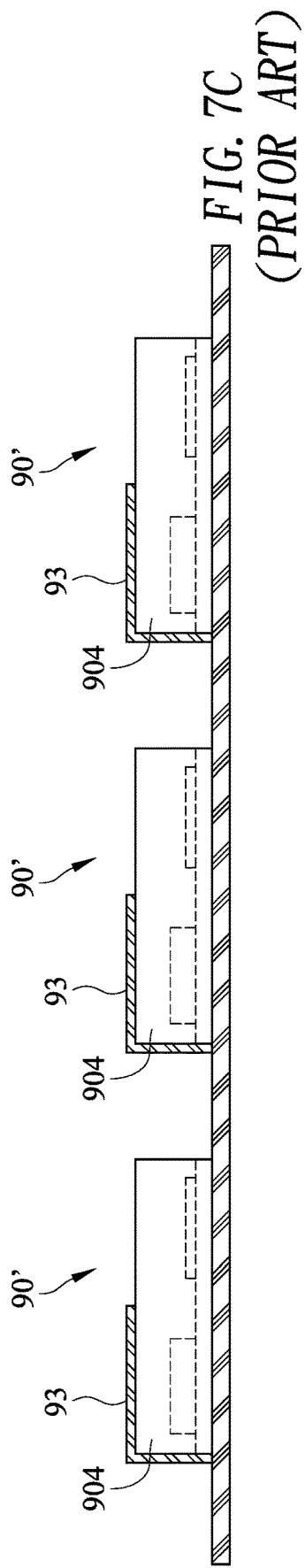

In the step (c), as shown in FIG. 5C, the second cavity 712 is enclosed. In this embodiment, a mask 80 is provided to cover the positioning plate 70 and enclose the second cavity 712. The mask 80 has multiple long apertures 81 aligning with the first cavities 711 arrayed in rows respectively. Under the circumstances, the first cavities 711 are exposed. The second cavities 712 are enclosed by the mask 80 and the first portion of the encapsulation 40 corresponding to the high-frequency device 20 is shielded. Furthermore, as shown in FIG. 6, another embodiment in accordance with the present invention is provided. The tapes 60 are adapted for aligning with the second cavities 712 and attaching to the positioning plate 70 so that the first portion of the encapsulation 40 corresponding to the high-frequency device 20 is shielded as well.

Figure 5D:
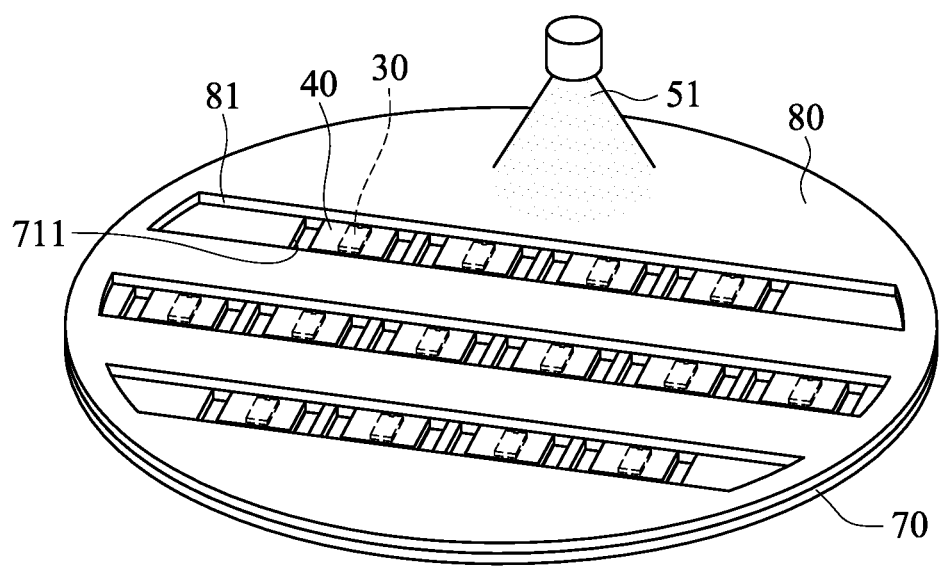
Figure 5E:
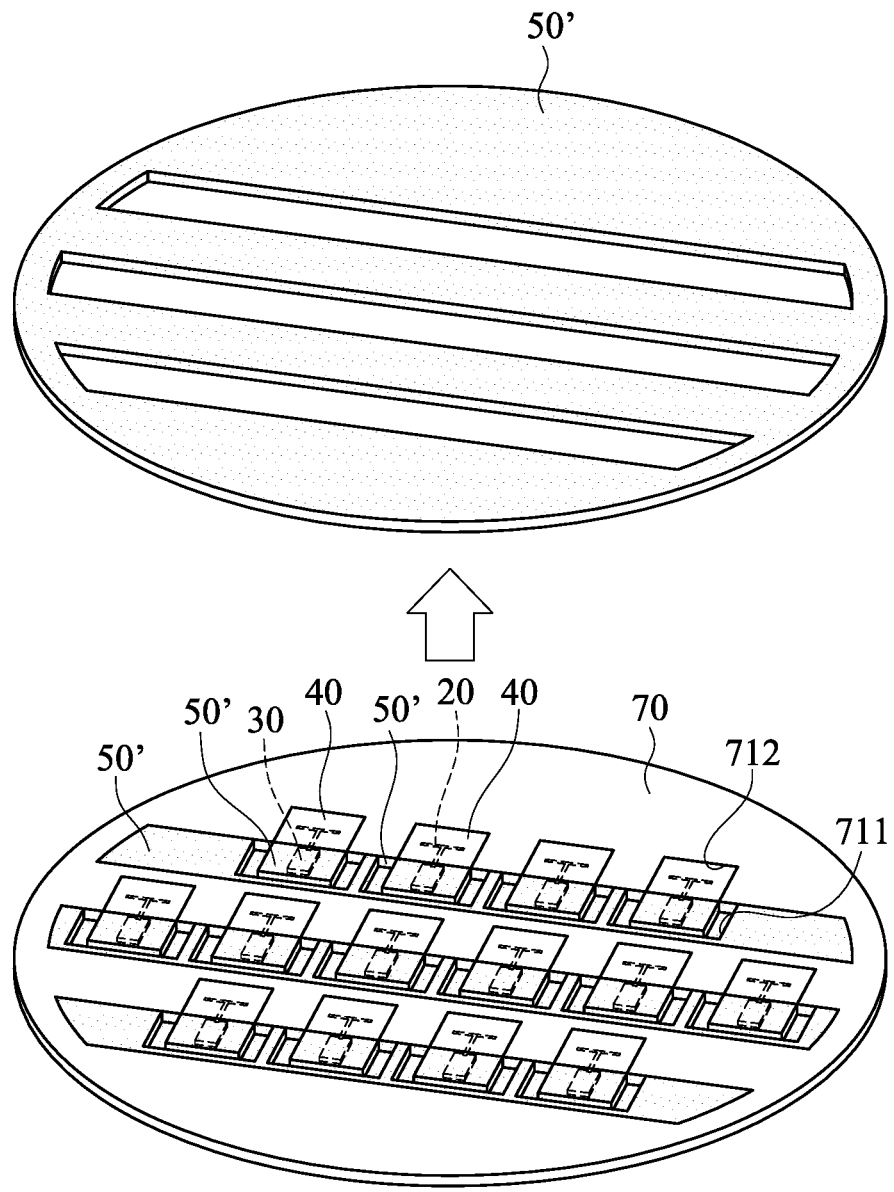
Figure 5F:
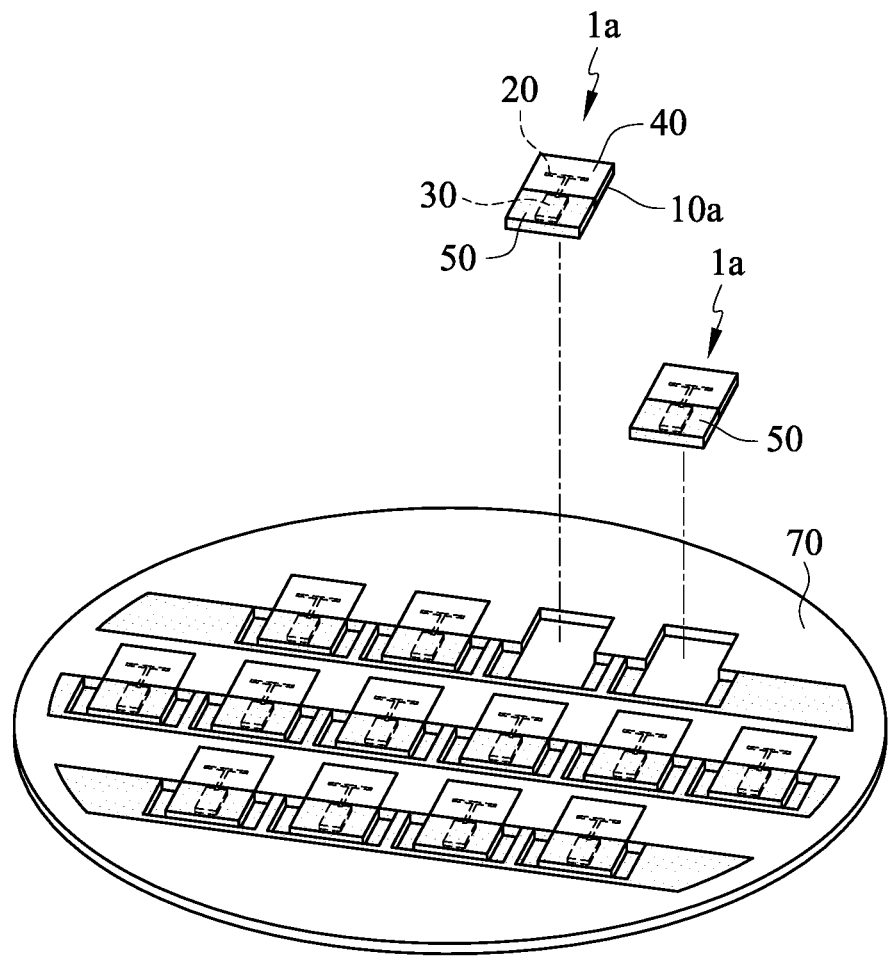

In the step (d), as shown in FIG. 5D and FIG. 5E, multiple metal layers 50' on the second portions of the encapsulations 40 of the semiconductor packages located at the first cavities 711 are formed. In this embodiment, the metallic ions 51 are deposited on the mask 80 by a process of sputtering or spraying. The portion of the positioning plate 70 exposed to the long apertures 81, the second portions of the encapsulations 40 of the semiconductor packages located at the first cavities 711 as well as the lateral sides of the substrate 10a of the semiconductor packages located at the first cavities 711 are deposited with the metallic ions 51 to form the metal layer. As a result, the metal layer 50' may be formed on the second portions of the encapsulations 40 corresponding to the chips 30 in the same step, even more, the metal layer 50' is formed at the lateral sides of the substrate 10a corresponding to the chip 30 as well. In the step (e), as shown in FIG. 5E and FIG. 5F, the second cavities 712 are open. Each of the semiconductor packages 1a having the partial outer metal layer are removed from the positioning plate 70. In this embodiment, when the mask 80 is removed, multiple semiconductor packages 1a having the partial outer metal layer may be uncovered. Meanwhile, as shown in FIG. 6, when the tapes 60 are removed after the step (d), multiple semiconductor packages 1a having a partial outer metal layer may be uncovered likewise.

Summarily speaking, the packaging method in accordance with the present invention either provides a specific substrate for packaging the multiple semiconductor packages or provides the positioning plate adapted for containing multiple semi-manufactured packages. Therefore, each of the multiple semiconductor packages having a partial outer metal layer may be produced rapidly and comprehensively.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A semiconductor package having a partial outer metal layer, comprising:
   a substrate having a first substrate part and a second substrate part; wherein the second substrate part extending horizontally from a lateral side of the first substrate part and a width of the second substrate part is smaller than a width of the first substrate part;
   a high-frequency device bonded to the first substrate part;
   a chip bonded to the second substrate part;
   an encapsulation formed on the substrate and encapsulating the chip and the high-frequency device; and
   a metal layer covering multiple exterior sides of the encapsulation corresponding to the second substrate part.

2. The semiconductor package as claimed in claim 1, wherein the metal layer further covers multiple external sides of the second substrate part.

3. The semiconductor package as claimed in claim 2, wherein the metal layer further covers multiple external sides of the first substrate part adjacent to the second substrate part.

4. The semiconductor package as claimed in claim 1, wherein the metal layer further covers multiple external sides of the first substrate part adjacent to the second substrate part.

5. The semiconductor package as claimed in claim 1, wherein the high-frequency device is an antenna.

* * * * *